United States Patent
Dimitrakopoulos et al.

(10) Patent No.: US 6,335,539 B1
(45) Date of Patent: Jan. 1, 2002

(54) METHOD FOR IMPROVING PERFORMANCE OF ORGANIC SEMICONDUCTORS IN BOTTOM ELECTRODE STRUCTURE

(75) Inventors: Christos Dimitrios Dimitrakopoulos, West Harrison; Ioannis Kymissis, New Hyde Park; Sampath Purushothaman, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/434,365

(22) Filed: Nov. 5, 1999

(51) Int. Cl.[7] .............................................. H01L 35/24
(52) U.S. Cl. .......................................... 257/40; 438/99
(58) Field of Search ...................... 257/40, 57; 438/99, 438/149, 151, 158, 161, 197

(56) References Cited

U.S. PATENT DOCUMENTS 5,693,977 A * 12/1997 Haddon et al. ............. 257/431
6,060,338 A * 5/2000 Tanaka et al. ................ 438/99
6,107,117 A * 8/2000 Bao et al. ..................... 438/99

* cited by examiner

Primary Examiner—David Nelms
Assistant Examiner—Quoc Hoang
(74) Attorney, Agent, or Firm—Scully, Scott, Murphy & Presser; Daniel P. Morris

(57) ABSTRACT

A method for improving the performance of an organic thin film field effect transistor comprising the steps of: (a) forming a transistor structure having patterned source and drain electrodes; and (b) treating the patterned source and drain electrodes with a thiol compound having the formula, RSH, wherein R is a linear or branched, substituted or unsubstituted, alkyl, alkenyl, cycloalkyl or aromatic containing from about 6 to about 25 carbon atoms under conditions that are effective in forming a self-assembled monolayer of said thiol compound on said electrodes. Organic thin film transistor structures containing the self-assembled monolayer of the present invention are also disclosed.

19 Claims, 1 Drawing Sheet

METHOD FOR IMPROVING PERFORMANCE OF ORGANIC SEMICONDUCTORS IN BOTTOM ELECTRODE STRUCTURE

FIELD OF THE INVENTION

The present invention relates to a method for improving the performance of thin film organic circuits having a readily manufacturable structure in which an organic semiconducting material is formed on the surface of patterned electrodes.

BACKGROUND OF THE INVENTION

Organic thin films (OFTs) have attracted considerable research interest due to their potential use as a replacement for other, more expensive semiconducting materials. Many organic materials, such as pentacene and hexithiopene, have performance properties that are competitive with amorphous silicon. Other superior characteristics, such as mechanical flexibility and the availability of room temperature deposition processes, make the organic materials possible replacements in low cost applications. These characteristics also make organic thin films a suitable candidate for use in low speed logic and radio frequency applications such as an active tag or a smart card.

The usual form of deposition of structures containing organic thin films is known in the art as an inverted thin film transistor structure. A conductive gate and an insulating layer are first formed on a suitable substrate. The gate is often a patterned or blanket metal or conductive diffusion layer. The insulator is typically $SiO_2$ or an organic material such as polyimide. There are two major methods known in the art for defining the source and drain electrodes in such a structure: The first method comprises laying down the organic semiconductor, i.e. organic thin film, and then depositing the source/drain electrodes through a shadow mask. In the other method, the source and drain electrodes are deposited and patterned using any method, and then the organic semiconductor is deposited. The organic semiconductor may be unpatterned or patterned using, for example, a shadow mask.

There is a significant advantage in using a process in which the metal for the source and drain electrodes is laid down first. Namely, the metal may be deposited and patterned using any of several processes including photolithography and stamp etching. Once deposited onto the organic semiconducting material, metals are difficult to pattern since semiconducting organic layers are generally very sensitive to exposure to processing chemicals. The major disadvantage to patterning the source/drain electrodes first and then depositing the organic semiconductor is that the organic semiconductor exhibits inferior performance when deposited onto preexisting source/drain electrodes.

Experiments have demonstrated a significant performance penalty when the organic semiconductor is directly deposited onto preexisting source/drain electrodes to identical transistor geometry formed by deposition of the metal on top of the organic semiconductor material. This is believed to be caused by the less favorable structure of the organic thin film formed when deposited onto the metal. When the organic semiconductor is deposited onto a dielectric substrate, more self-assembly into larger grains is seen. This leads to a higher performance semiconductor.

There is no known recognition of this problem in the literature, and all reports of high performance organic devices use the top electrode geometry. Other techniques reported in the prior art for increasing the performance of organic thin film semiconductors use high temperatures (See, T.N. Jackson, et al. "Stacked Pentacene Layer Organic Thin-Film Transistors with Improved Characteristics", IEEE Electron Device Letters, Vol. 18, No. 12, p. 606, December 1997), or use self-assembled monolayers on the gate insulator. These prior art techniques do not, however, address the problem of the metal contacting the organic thin film semiconductor.

The deposition processes used to date in the prior art thus suffer from the following disadvantages:

(i) Top electrode deposition of metal onto organic thin films is difficult to pattern lithographically.

(ii) Top electrode depositions generally require the use of shadow masks which are fragile; can only pattern small areas; are of lower resolution than the lithographic processes used to create them; and the shadow masks must be cleaned. Additionally, the edges of films defined by masks are often irregular due to adhesion to the mask.

(iii) Bottom electrode depositions have inferior performance to top electrode deposition.

(iv) Use of an elevated temperature to improve performance restricts the type of substrates, which may be used to form the device.

(v) Use of an alignment layer on the substrate does not increase the ordering on the electrodes or at the electrode/semiconductor interface, and is not effective in increasing the grain size in small channels.

(vi) Use of a self-assembled monolayer on the substrate improves performance of some devices, but restricts the choice of substrates to materials compatible with such layers (namely, $SiO_2$ layers) and does not solve the performance penalty associated with the deposition of organic materials on metals.

In view of the above drawbacks in prior art processes of producing high performance structures containing organic semiconducting thin films, there is a need for developing a method in which the organic thin films can be formed on top of the source/drain electrodes without inducing a performance penalty.

SUMMARY OF THE INVENTION

One object of the present invention is to provide a process for producing high performance organic thin film transistors in which the source and drain electrodes are deposited and patterned before the organic semiconducting material is deposited.

Another object of the present invention is to provide a more readily manufacturable process for higher performance organic field effect transistors that can be used to create large area circuits.

A further object of the present invention is to provide a process for increasing the performance of organic field effect transistors that is independent of the deposition and patterning method of both the organic semiconductor and the source and drain metals.

Other objects of the present invention include:

(I) To provide a process which operates on two common metals that are compatible with organic semiconductors, namely gold and platinum.

(II) To provide a process which operates at room temperature.

(III) To provide a process which operates independently of the layers underneath the top surface of the metal used to form the electrodes, which may be serving as a more easily patterned seed electroplating layer, an adhesion layer or may serve some other purpose.

(IV) To provide a process that operates independently of the substrate used permitting, for example, the use of organic substrates.

(V) To provide a process that improves the performance of the devices at all scales, including very short channel lengths.

These and other objects and advantages can be achieved by utilizing the present method which includes a step of treating exposed surfaces of source and drain electrodes of a transistor structure with a thiol compound under conditions effective in forming a self-assembled monolayer of said thiol compound on said source and drain electrodes. It is noted that the thiol treatment step of the present invention is carried out before the organic semiconductor material is formed.

Specifically, the method of the present invention comprises the steps of:

(a) forming a transistor structure comprising at least patterned source and drain electrodes; and (b) treating the patterned source and drain electrodes with a thiol compound having the formula:

RSH wherein R is a linear or branched, substituted or unsubstituted, alkyl, alkenyl, cycloalkyl or aromatic containing from about 6 to about 25 carbon atoms under conditions that are effective in forming a self-assembled monolayer of said thiol compound on said electrodes. It is again emphasized that the transistor structure of step (a) above does not include the presence of an organic semiconducting thin film material. Instead, the organic semiconducting thin film material is formed in the structure only after step (b) is performed.

Another aspect of the present invention relates to an organic thin film transistor that comprises at least bottom source/drain electrodes having an organic semiconductor formed over said bottom source/drain electrodes, wherein said bottom source/drain electrodes have a self-assembled monolayer formed thereon, said self-assembled monolayer comprising a thiol compound having the formula:

RSH wherein R is a linear or branched, substituted or unsubstituted, alkyl, alkenyl, cycloalkyl or aromatic containing from about 6 to about 25 carbon atoms.

Single gate transistor structures and dual gate structures are contemplated. Thus, the present invention contemplates transistor structures wherein the gate region (gate insulator and gate) is formed below the organic semiconductor, above the organic semiconductor or both above and below the organic semiconductor.

DETAILED DESCRIPTION OF THE INVENTION

Figure 1:
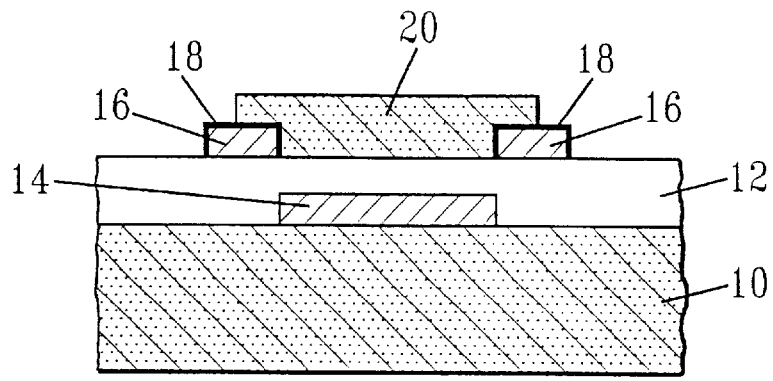
FIG. 1 is a cross-sectional view of a thin film transistor (TFT) structure formed using the process of the present invention.

The present invention which provides a method of forming high performance organic thin film transistors and other like circuitry will now be described in more detail by referring to the drawings that accompany the present application. It is noted that in the accompanying drawings like reference numerals are used for describing like and corresponding elements of the present invention. It is also noted that the term "thin film", when used in conjunction with the organic semiconducting material, denotes a film having a thickness of 5 micrometers (5 $\mu$m) or less. The term "thin film" is used to distinguish the organic layer used from bulk material, most often used in a single crystalline form.

Reference is first made to FIG. 1 which illustrates one possible TFT structure that can be produced using the process of the present invention. Specifically, the structure shown in FIG. 1 comprises a substrate 10 having a gate 14 formed on an exposed surface of substrate 10. The structure shown in FIG. 1 also comprises a gate insulator 12 that is formed on top of gate 14 and on any remaining exposed areas of substrate 10. It is noted that the gate insulator and the gate make up the gate region of the structure.

Source/drain electrodes 16 are formed on gate insulator 12 and an organic thin film semiconductor 20 is formed on top of a portion of the source/drain electrodes and any exposed areas of the gate insulator 12 between the electrodes. A key element of FIG. 1 is that a self-assembled monolayer 18 of the present invention is present on the source/drain electrodes.

The presence of the self-assembled monolayer on the surface of the electrodes (source and drain) improves the performance of the transistor. Without wishing to be bound by any theory, it is believed by the applicants'that the self-assembled monolayer of the present invention changes the surface behavior of the metal used in making the electrodes in such a way as to encourage the self-assembly of the organic semiconductor material into an ordered system near the electrodes. This behavior is not normally seen in the prior art.

Suitable substrates that can be employed in the present invention include, but are not limited to: Si-containing substrates such as Si, $SiO_2$, SiGe, silicon-on-insulators and glass and Al-containing substrates such as sapphire; organic materials such as polyethylene terphthalate (PET) and polycarbonate; inorganic materials such as diamond, diamond-like carbon (amorphous diamond), interconnect structures and metal layers; and mixtures thereof. The substrate may also be a circuit board or laminate. A highly preferred substrate is a Si wafer (heavily doped) in which a thermally grown $SiO_2$ layer is present therein. This substrate is highly preferred since the $SiO_2$ region serves as a common gate.

The substrate may contain various active device regions and/or isolation regions either on the surface thereof or in the substrate itself. For example, the substrate may contain source/drain regions, shallow trench isolation regions, field oxide regions, metallization layers, dielectric layers and other like layers that are typically present in transistor structures.

Gate 14 is composed of a conventional gate conductor that is well known to those skilled in the art. For example, the gate can be composed of a conductive metal such as aluminum, tungsten, copper or chromium, or, alternatively, doped single crystalline Si or polysilicon can be used as the gate conductor or an organic conductor such as polyaniline. Of these gate materials, a gate comprising n-doped single crystalline Si is highly preferred herein. The gate is formed by first depositing or growing the gate material and then patterning the same using conventional lithography and etching. Conventional deposition processes that can be used in forming the gate include, but are not limited to: chemical vapor deposition, plasma-assisted chemical vapor deposition, sputtering, evaporation or other like deposition processes may be employed. When polysilicon or single crystal Si is used, the doping may take place during the deposition process using an in-situ process or after, using ion implantation and annealing.

Gate insulator 12 is comprised of conventional dielectric materials well known to those skilled in the art. For example, the gate insulator may comprise an organic dielectric material such as polyimide, polyamide, parylene, polymethylmethacrylate and other like organic materials or an inorganic dielectric material such as $Si_3N_4$, $SiO_2$, perovskite-type oxides and other like inorganic materials. The gate insulator is formed using conventional processes well known to those skilled in the art, including any of the previous mentioned deposition processes used in forming the gate. Of the above mentioned gate insulators, $SiO_2$ is highly preferred in the present invention.

Electrodes 16 are composed of the same or different conductive metal, metal alloy, metal oxide or metal oxide alloy that contains at least one metal that is highly conductive. Such conductive metals are well known to those skilled in the art and include, for example, platinum (Pt), palladium (Pd), aluminum (Al), gold (Au), tungsten (W), chromium (Cr) or titanium (Ti). The electrodes may be single layered, but preferably the electrodes comprise a stack of two or more metal layers, i.e. a metal stack of Cr and Au, with Au on top, or Ti and Pt, with Pt on top. It is highly preferred that a high work function metal is in proximity to the organic complexes so that carrier injection is facilitated. The electrode (unpatterned) is formed using conventional deposition processes such as evaporation, chemical vapor deposition, plasma-assisted chemical vapor deposition and sputtering, and a patterned electrode is provided by conventional lithography and etching. Alternatively, a shadow mask may be used in forming the patterned electrodes.

Organic semiconducting material 20 is a solvent sensitive material including, but not limited to: pentacene, hexithiopene, polythiopene, phthalocyanine and other like organic materials. Of these materials, pentacene is preferred in the present invention. As stated above, the organic semiconducting material is a thin film material having a thickness of about 5 $\mu$m or less. More preferably, the organic semiconducting material has a thickness of from about 100 to about 1000 A.

The organic semiconducting material is formed using conventional deposition processes that are well known in the art. For example, the organic semiconducting material is formed by molecular beam deposition, vacuum evaporation, sublimation, spin-on coating, dip coating and other like deposition processes. Of these deposition processes, it is highly preferred that the organic semiconducting material be formed by molecular beam deposition in an ultra-high vacuum of less than $1 \times 10^{-6}$ torr.

As mentioned above, the structure of FIG. 1 (as well as FIGS. 2 and 3) includes a self-assembled monolayer 18 that is formed on the surface of the electrodes prior to deposition of the organic thin film semiconductor. The self-assembled monolayer of the present invention comprises a thiol compound having the formula:

RSH wherein R is a linear or branched, substituted or unsubstituted, alkyl, alkenyl, cycloalkyl or aromatic containing from about 6 to about 25 carbon atoms. When substituted, the substituent may be an alkyl having from 1 to about 3 carbon atoms, a halogen such as Cl, Br, F or I, hydroxyl, ammonium and other like substituents.

Examples of suitable thiol compounds include, but are not limited to: 1-hexadecanthiol and 1-octadecane thiol. Preferred thiols are those wherein R is an alkyl having from 16 to about 20 carbon atoms, with 1-hexadecanthiol being most highly preferred in the present invention.

Self-assembled monolayer 18 is formed on the electrodes prior to deposition of the organic thin film by subjecting the electrodes to a treatment process that is effective in forming a monolayer of said thiol compound on the surface of the electrodes. Specifically, the monolayer is formed by immersing the structure in a thiol-containing solution. The treatment process is carried out at room temperature for a time period of from about 0.5 to about 24 hours. Elevated temperatures up to 70° C. can also be used as long as the elevated temperature does not adversely effect the various layers of the structure. The thiol-containing solution may be a concentrated solution or, more preferably, it is a dilute solution in which the thiol compound is dissolved in a solvent such as ethanol or heptane. In a highly preferred embodiment of the present invention, a dilute solution containing from about 0.001 to about 0.01% thiol compound is employed in forming the self-assembled monolayer.

After treatment with the thiol compound, the structure is removed from the thiol-containing solution, dried and then the organic semiconductor material is formed thereon. The drying step is typically conducted at a temperature of from about 25° to about 30° C. for a time period of from about 1 to about 5 minutes. Other temperatures and times are also contemplated herein.

Figure 2:
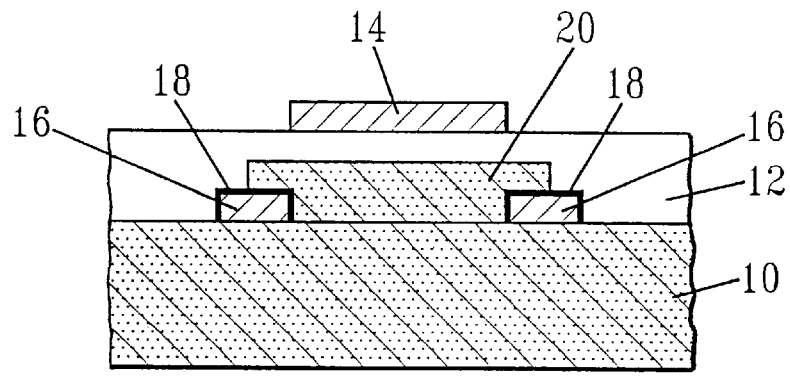
FIG. 2 is a cross-sectional view of an alternative TFT structure formed using the process of the present invention.
Figure 3:
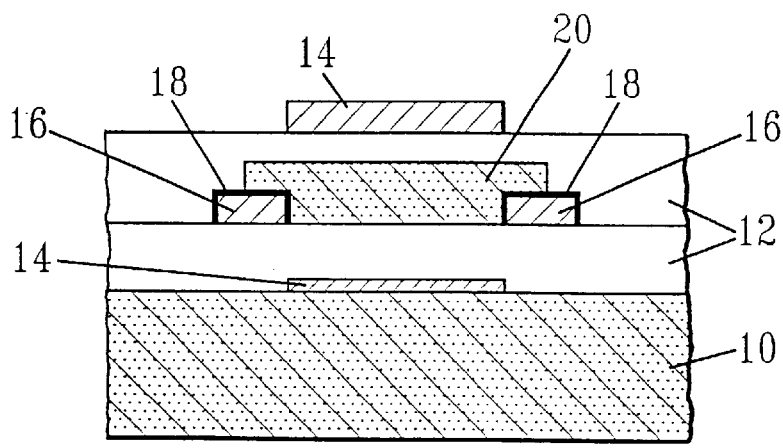
FIG. 3 is a cross-sectional view of yet another alternative TFT structure that can be formed using the process of the present invention.

FIG. 1 (and the above description) illustrates one embodiment of the present invention. There are several possibilities for other embodiments. Some examples of other embodiments are shown in FIGS. 2 and 3. Specifically, in FIG. 3, electrodes 16 may be formed on substrate 10 and then patterned. Self-assembled monolayer 18 is then formed on the electrodes and next organic semiconductor 20 is deposited. After deposition of the organic semiconductor, gate insulator 12 is formed and then gate 14.

A dual gate structure is shown in FIG. 3. In this figure, the single gate structure shown in FIG. 1 is first formed and thereafter a second gate insulator 12 is formed on the structure of FIG. 1 and then a top gate 14 is formed. In the dual gate structure, one of the gates is formed on top of the organic semiconductor and the other gate is formed beneath the organic semiconductor.

Other standard thin film transistor structures that are apparent to those skilled in the art can also be used in the present invention. In these other structures, the formation of the monolayer of thiol compound on the electrodes, as described above, distinguishes the present invention from prior art transistor structures.

By practicing the method of the present invention, the following advantages to the conventional solution of placing the electrodes on top of the organic semiconductor become evident:

(a) The performance penalty associated with depositing the organic material after the electrodes is no longer present. This permits the deposition and patterning of the metal by any means needed. This obviates the need for shadow masks, and permits the use of fast, inexpensive and high yield deposition and patterning processes such as photolithography and electroplating.

(b) The inventive method occurs at room temperature and is independent of the substrate, gate electrode, gate position and other variables. The inventive method may improve the performance of virtually all known thin film transistor geometry'formed with semiconductor deposited onto metal source and drain lines.

(c) The inventive method is independent of layers underneath the top layer. Gold and platinum form an ohmic contact to most currently known organic semiconductors. 1-hexadecanethiol and related thiol compounds react to form self-assembled monolayers on gold and platinum, independent of the layers underneath. Very thin layers of these expensive metals may therefore be used while still realizing high performance from this process.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the appended claims.

Having thus described our invention in detail, what we claim as new and desire to secure by the Letters Patent is:

1. An organic thin film transistor comprising at least bottom source/drain electrodes having an organic semiconductor formed over said bottom source/drain electrodes, wherein said bottom source/drain electrodes have a self-assembled monolayer formed thereon, said self-assembled monolayer comprising a thiol compound having the formula:

$$RSH$$

wherein R is a linear or branched, substituted or unsubstituted, alkyl, alkenyl, cycloalkyl or aromatic containing from about 6 to about 25 carbon atoms.

2. The organic thin film transistor of claim 1 wherein a gate region is formed above or below said organic semiconductor.

3. The organic thin film transistor of claim 1 wherein a gate region is formed above the organic semiconductor and below the organic semiconductor.

4. The organic thin film transistor of claim 2 wherein said gate region comprises a gate surrounded by a gate insulator.

5. The organic thin film transistor of claim 3 wherein said gate region comprises a gate surrounded by a gate insulator.

6. The organic thin film transistor of claim 1 wherein said patterned source and drain electrodes are composed of the same or different conductive metal, metal alloy, metal oxide, metal alloy oxide or a stack thereof.

7. The organic thin film transistor of claim 6 wherein said conductive metal is a metal selected from the group consisting of gold, platinum, tungsten, palladium, aluminum, chromium, titanium and a stack thereof.

8. The organic thin film transistor of claim 7 wherein said conductive metal is gold, chromium, platinum, titanium or a stack thereof.

9. The organic thin film transistor of claim 1 wherein said organic semiconductor material is a material selected from the group consisting of pentacene, hexithiophene, polythiophene and phthalocyanine.

10. The organic thin film transistor of claim 9 wherein said organic semiconductor is pentacene.

11. The organic thin film transistor of claim 1 wherein said patterned source and drain electrodes are formed on an exposed surface of a substrate.

12. The organic thin film transistor of claim 11 wherein said substrate is a Si-containing substrate selected from the group consisting of $SiO_2$, Si, SiGe, silicon-on-insulator and glass.

13. The organic thin film transistor of claim 11 wherein said substrate is an Al-containing substrate.

14. The organic thin film transistor of claim 1 wherein said patterned source and drain electrodes are formed on a gate insulator.

15. The organic thin film transistor of claim 14 wherein said gate insulator is an inorganic or organic dielectric material.

16. The organic thin film transistor of claim 15 wherein said inorganic dielectric is $SiO_2$ or $Si_3N_4$.

17. The organic thin film transistor of claim 15 wherein said organic dielectric is polyimide, parylene or polymethylmethacrylate.

18. The organic thin film transistor of claim 1 wherein said thiol compound is 1-hexadecanethiol or 1-octadecane thiol.

19. The organic thin film transistor of claim 18 wherein thiol is 1-hexadecanethiol.

* * * * *